United States Patent [19]

Wolfram

[11] Patent Number: 4,712,297

[45] Date of Patent: Dec. 15, 1987

[54] METHOD OF MANUFACTURING SUPPORTS FOR ELECTRICAL CIRCUITS

[76] Inventor: Claude J. Wolfram, 11, rue Victor Nessler, Strasbourg, France, 67000

[21] Appl. No.: 908,676

[22] Filed: Sep. 18, 1986

[30] Foreign Application Priority Data

Sep. 18, 1986 [FR] France .................................. 85 13803

[51] Int. Cl.⁴ .............................................. H01K 3/10
[52] U.S. Cl. ...................................... 29/852; 204/15; 427/97
[58] Field of Search ................. 29/846, 847; 174/68.5; 204/15; 427/97

[56] References Cited

U.S. PATENT DOCUMENTS 3,702,284  11/1972  Merkenschlager ............... 427/97 X
4,389,278   6/1983  Kai ..................................... 427/97 X Primary Examiner—Howard N. Goldberg
Assistant Examiner—Carl J. Arbes
Attorney, Agent, or Firm—Holman & Stern

[57] ABSTRACT

In a method of manufacturing supports for electrical circuits, a conductive coating is applied to both sides of a board. Holes are drilled in the coated board. A discontinuity is produced in the electrical conductivity around at least some of these holes on at least one side of the board to prevent electrolytic deposition on the walls of these holes. A conductive material is then deposited at predetermined positions by electrolysis. After both sides of the board and the walls of the holes have been coated with the conductive material, the aforementioned discontinuity in the electrical conductivity around some of the holes on at least one side of the board is obtained by removing this conductive material in localized areas around the holes concerned.

2 Claims, 15 Drawing Figures

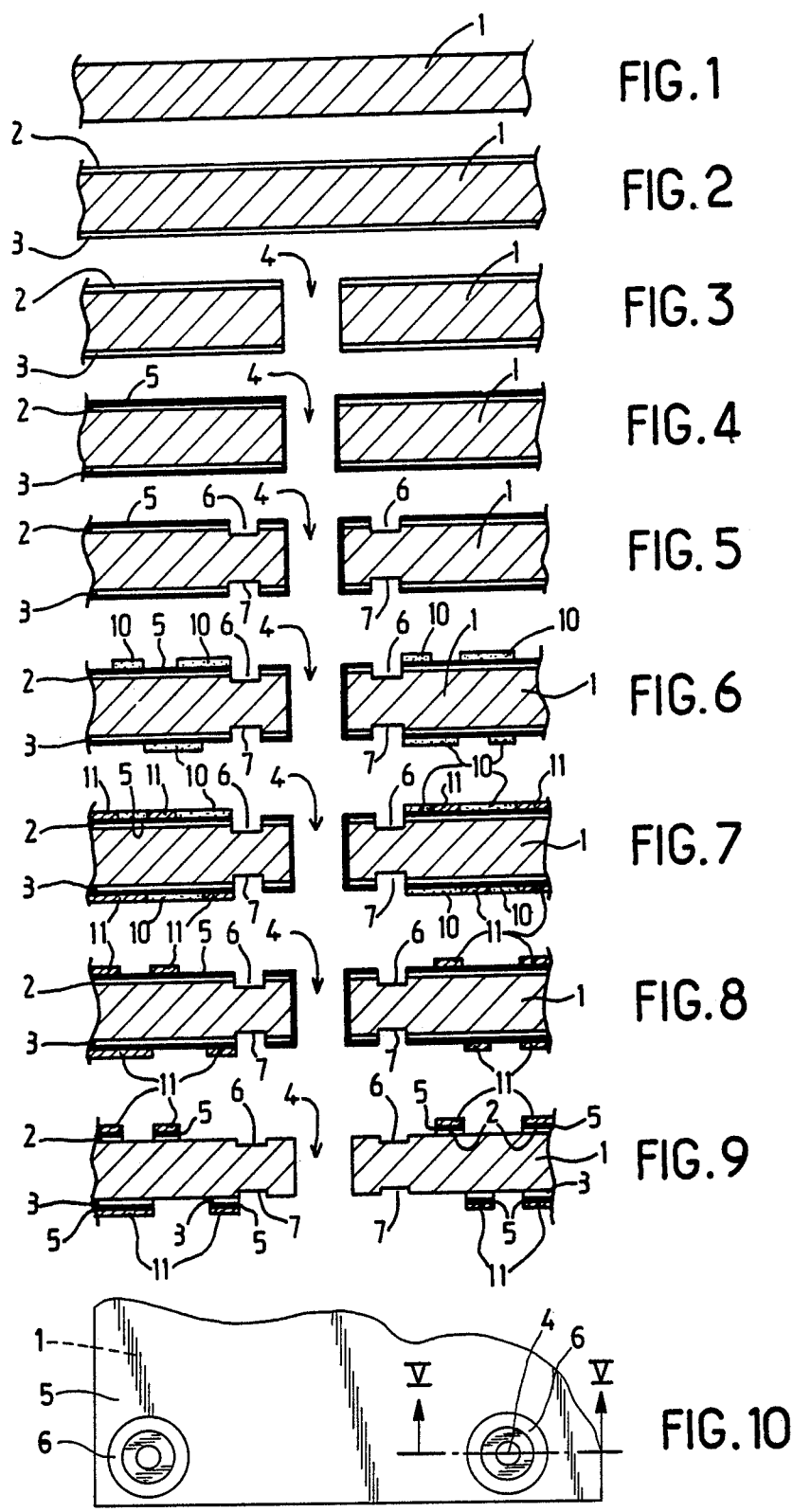

METHOD OF MANUFACTURING SUPPORTS FOR ELECTRICAL CIRCUITS

BACKGROUND OF THE INVENTION

1. Field of the Invention

The present invention concerns a method of manufacturing supports for electrical circuits.

2. Description of the Prior Art

It is known that to manufacture supports for electrical circuits, in particular so-called "printed" circuits, it is necessary to carry out a certain number of processing phases on a board so that this is finally provided with the necessary conductive circuits whereas it is itself made from an insulative material.

The board must also have numerous holes through it into which may be inserted the connecting leads of electrical and electronic components, with the result that the walls of these holes must also be covered by a conductive deposit providing an electrical connection between the two sides of the board.

Unfortunately, the boards must also have in them holes used to position them during automatic insertion of electronic components, usually referred to as "locating" holes.

Automatic component insertion is a high-precision operation and because of this the locating holes must be very accurately placed and their diameter is subject to extremely severe tolerance limits, in the order of 4/100 millimeter at most.

Conductive coatings obtained by electrolytic means cannot guarantee such accuracy, however.

There are also cases where it is necessary to ensure that holes other than the locating holes retain the same diameter and surface state as they had before electrolytic deposition of the conductive material.

The present invention offers a solution to these problems and makes it possible to obtain supports for electrical circuits with holes, especially locating holes, retaining the precise diameter determined by the machine which formed the holes.

SUMMARY OF THE INVENTION

The invention consists in a method of manufacturing supports for electrical circuits comprising the steps of applying a conductive coating to both sides of a board, drilling holes in the coated board, causing a discontinuity in the electrical conductivity around at least some of the holes on at least one side of the board to prevent electrolytic deposition on the walls of said at least some holes and depositing a conductive material at predetermined positions by electrolytic means.

According to one feature of the invention, after both sides of the board and the walls of the holes have been coated with the conductive material, the discontinuity in the electrical conductivity around at least some of the holes on at least one side of the board is obtained by removing the conductive material in localized areas around said at least some holes.

The invention will be better understood from the following detailed description given with reference to the appended drawings. It is to be understood that the description and the drawings are given by way of non-limiting example only.

BRIEF DESCRIPTION OF THE DRAWINGS

FIGS. 1 through 9 are schematic views showing the manufacturing method in accordance with the invention beginning with a plain board (FIG. 1) and ending with the finished board equipped with various conductive circuits (FIG. 9).

FIG. 10 is a partial schematic plan view of the board corresponding to the processing stage represented by FIG. 5.

DESCRIPTION OF THE PREFERRED EMBODIMENT

Figure 11:
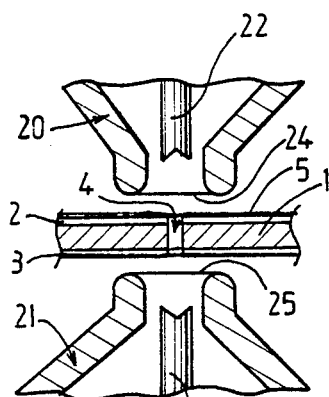
FIGS. 11 through 13 are schematic views showing three phases for producing the discontinuity in conductivity by means of a machine tool.

Referring to FIGS. 1 through 10, it is seen that the method in accordance with the invention for manufacturing supports for electrical circuits begins with the provision of a board 1 of an insulative material such as a synthetic material, this board being obtained by cutting it out from a larger sheet, for example.

A board 1 of this kind is then covered with conductive coatings 2 and 3 on respective sides so that its surfaces are conductive, with the objective of subsequently obtaining continuous electrical conductivity between the two sides.

Once the board 1 has been coated in this way, the holes necessary for a particular circuit and the locating holes are drilled, only one of these locating holes 4 being shown here.

A second conductive coating 5 is then deposited on the board 1 by chemical means so that the coating 5 extends into all the holes, including the hole 4, and over both sides of the board 1 so as to ensure continuous electrical conductivity between the two sides of the board 1 through the holes.

Because of this continuity it is then possible to carry out electrolytic deposition and the problem to which the invention is directed is preventing such deposition in certain holes, especially the locating holes such as the hole 4, so that these retain exactly the same dimensions as they have when the plate 1 is in the state schematically represented in FIG. 3.

In accordance with the invention, a discontinuity is formed in the electrical conductivity around the holes for which a precise diameter and/or a neutral electrical state is to be preserved, and to this end the coating 5 is removed over a closed area around each hole to be protected.

In this instance such removal is obtained mechanically and a circular groove 6 is created by means to be described later.

It might be sufficient to create the groove 6 on one side of the board 1 only, but in practise it is preferable also to create a groove 7 symmetrical to the groove 6 on the other side of the board 1, as shown in FIGS. 5 through 10, 14 and 15.

After this discontinuity has been produced by creating the grooves 6 and 7 the board 1 is as shown in FIG. 10 in which it is seen that one side of the board 1 is entirely covered with the coating 5 and each protected hole is surrounded by a groove 6 exposing the insulative material of which the board 1 is made.

Because of the presence of the conductive coating 5, there is electrical continuity between the two sides of the plate 1 except through the holes protected by the grooves 6 and 7, with the result that the board 1 may receive, by means of the well-known electroplating technique, a temporary coating 10 which is deposited only on predetermined areas, by virtue of a process which has rendered these areas selectively adapted to receive the coating 10 whereas the other areas are prevented from doing so and remain free of the coating (FIG. 6).

The board 1 with the coating 10 is then subjected to an electrolysis operation to deposit a conductive coating 11 which attaches to the board 1 only over the coating 5, that is to say in the areas which do not comprise the coating 10, as shown in FIG. 7.

Chemical means may then be employed to remove the coating 10 so that only the conductive coating 11 remains, as shown in FIG. 8.

Finally, the coating 5 and the coatings 2 and 3 are removed simultaneously during a chemical operation, but they are not removed from the places covered with the coating 11, as is shown in FIG. 9.

Note that after the hole 4 is formed (FIG. 3) its walls are covered by the coating 5 since this is deposited by chemical means which are not affected by any continuous electrical conductivity between the two sides of the board 1, there being no such continuity at this stage.

Note also that at the end of the process (FIG. 9) the coating 5 is removed from the hole 4 which thus returns to its exact original dimensions, which may be extremely precise (FIG. 3).

Figure 12:
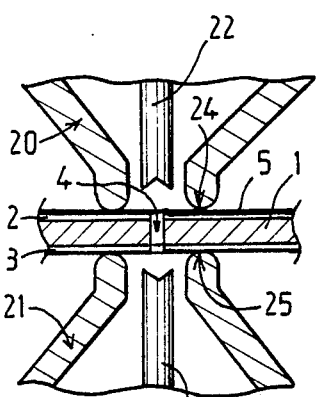
Figure 13:
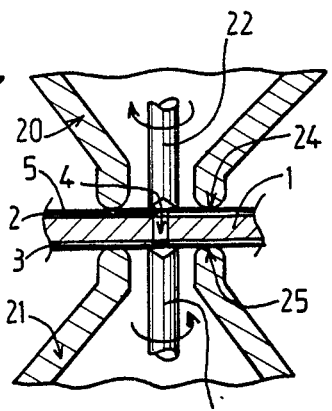

Referring to FIGS. 11 through 13, it is seen that to form the grooves 6 and 7 simultaneously use may be made of a machine tool comprising two heads 20 and 21 situated in face-to-face relationship and leaving a space between them with sufficient clearance to permit the insertion there of a board 1 covered with the coatings 2, 3 and 5. At the center of the heads 20 and 21 are respective rotating facing cutters 22 and 23.

The board 1 may be mounted extremely precisely using the holes in the board and once it has been positioned the heads 20 and 21 are caused to move towards each other so that their respective rounded edges 24 and 25 clamp the board 1 between them and support it all around the central hole 4 to be protected (FIG. 12); once this has been achieved, the facing cutters 22 and 23 are simultaneously caused to move towards each other and to rotate; they are of the known type operative only at the periphery (FIG. 13).

Figure 14:
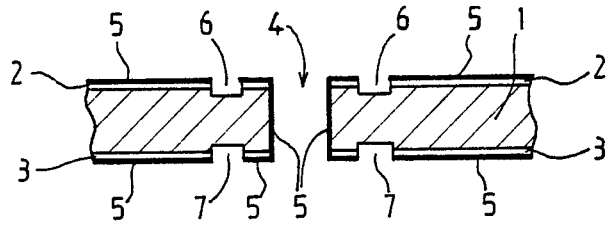
FIG. 14 is a schematic partial view showing a board in accordance with the invention after formation of the electrical discontinuity, that is to say after intervention by the machine tool shown in FIGS. 11 through 13, FIG. 14 being identical to FIG. 5.

At the end of this operation the board 1 is as shown in FIG. 14, which corresponds precisely to FIG. 5.

Figure 15:
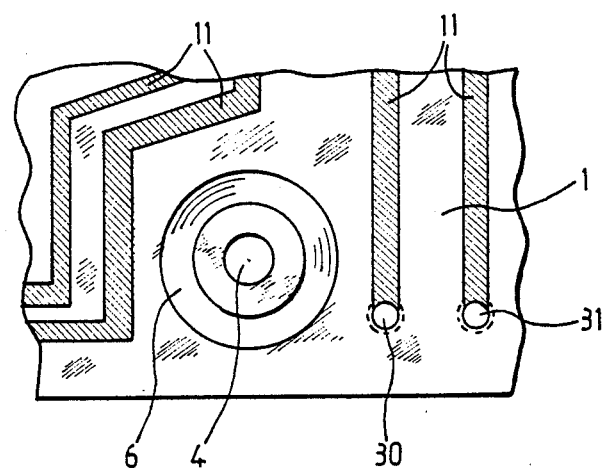
FIG. 15 is a partial schematic plan view of a board in accordance with the invention at the end of the manufacturing process, this figure corresponding to the cross-sectional view of FIG. 9.

FIG. 15 shows schematically in plan view part of a board 1 when it is completely finished, that is to say when it corresponds to the diagram of FIG. 9.

It is seen that the board 1 is exposed in its original state, as shown in FIG. 1, and that it carries the conductive coating 11 in the form of a more or less complex circuit.

As the coating 5 has been removed along with the coatings 2 and 3, there is no difference in appearance between the board 1 proper, the groove 6 and the part situated between the groove 6 and the hole 4.

On the other hand, when the board 1 has not yet received the electronic components it features holes covered internally by the coating 5 and by the coating 11 in order to provide electrical continuity between the conductors 11 on one side and any conductors on the other side.

Thus in FIG. 15 the holes 30 and 31 are of smaller diameter than when they were first made in the board 1 since their walls are covered with conductive material, as suggested by a dashed line which represents the original diameter while the continuous central line represents the diameter of the coated hole.

The method in accordance with the invention may be used specifically to protect the locating holes but it is to be understood that it may also be used for holes other than those intended for locating the board, that is to say wherever it is necessary to prevent electrical conductivity through such holes.

There is claimed:

1. Method of manufacturing supports for electrical circuits, comprising the steps of applying a conductive coating to both sides of a board, drilling holes in the coated board, causing a discontinuity in the electrical conductivity around at least some of said holes on at least one side of said board to prevent electrolytic deposition on the walls of said at least some holes and depositing a conductive material at predetermined positions by electrolytic means.

2. Method according to claim 1, wherein after both sides of said board and the walls of said holes have been coated with said conductive material, said discontinuity in the electrical conductivity around at least some of said holes on at least one side of said board is obtained by removing said conductive material in localized areas around said at least some holes.

* * * * *